United States Patent
Kageyama et al.

(10) Patent No.: US 8,879,592 B2
(45) Date of Patent: Nov. 4, 2014

(54) SEMICONDUCTOR LASER DEVICE

(75) Inventors: Nobuto Kageyama, Hamamatsu (JP); Hirofumi Miyajima, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/877,911

(22) PCT Filed: Oct. 12, 2011

(86) PCT No.: PCT/JP2011/073433
§ 371 (c)(1),
(2), (4) Date: Jul. 2, 2013

(87) PCT Pub. No.: WO2012/050132
PCT Pub. Date: Apr. 19, 2012

(65) Prior Publication Data
US 2013/0279530 A1   Oct. 24, 2013

(30) Foreign Application Priority Data

Oct. 15, 2010 (JP) ............... P2010-232969
Oct. 15, 2010 (JP) ............... P2010-232973

(51) Int. Cl.
*H01S 3/04* (2006.01)
*H01S 5/024* (2006.01)
*H01S 5/40* (2006.01)
*H01S 5/022* (2006.01)

(52) U.S. Cl.
CPC .......... *H01S 5/02423* (2013.01); *H01S 5/4025* (2013.01); *H01S 5/02264* (2013.01); *H01S 5/02272* (2013.01); *H01S 5/02236* (2013.01); *H01S 5/02492* (2013.01)
USPC .............................................. 372/35; 372/36

(58) Field of Classification Search
CPC ..... H01S 5/022; H01S 5/02236; H01S 5/024; H01S 5/02407; H01S 5/02423
USPC .......................................... 372/43.01, 35, 36
See application file for complete search history.

(56) References Cited

U.S. PATENT DOCUMENTS

2005/0168950 A1* 8/2005 Yoshioka et al. ............ 361/699
2006/0227827 A1 10/2006 Kawanishi et al.

FOREIGN PATENT DOCUMENTS

| JP | 2004-207619 A | 7/2004 |
|----|---------------|--------|
| JP | 2005-217211 A | 8/2005 |
| JP | 2006-294943 A | 10/2006 |
| JP | 2007-073549 | * 3/2007 |
| JP | 2007-73549 A | 3/2007 |
| JP | 4002234 B2 | 10/2007 |
| JP | 2010-74122 A | 4/2010 |

* cited by examiner

*Primary Examiner* — Armando Rodriguez
(74) *Attorney, Agent, or Firm* — Drinker Biddle & Reath LLP

(57) ABSTRACT

A semiconductor laser bar 2 is mounted onto a liquid-cooled heat sink 1. A molybdenum reinforcement member 3 is fixed onto the surface opposite to the surface on which the semiconductor laser module 2 is mounted. The molybdenum has a linear expansion coefficient less than that of the heat sink 1. Sub-mounts are preferably made of a Cu—W alloy, more preferably of the reinforcement member 3 molybdenum. In this case, the stresses that are imposed on the heat sink 1 when being expanded or contracted can cancel each other out.

2 Claims, 17 Drawing Sheets

*Fig.5*
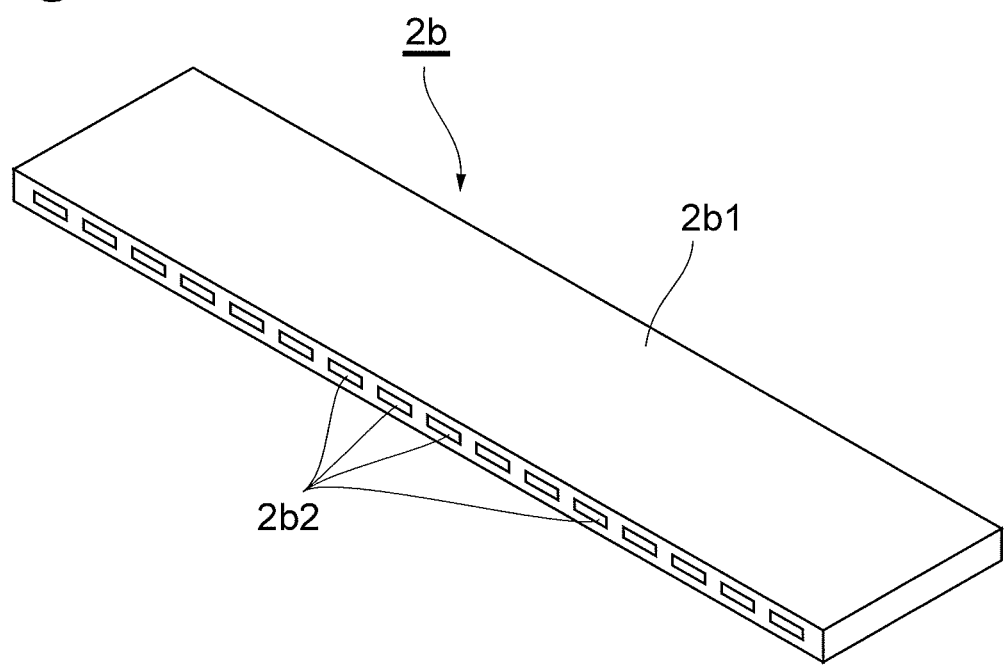
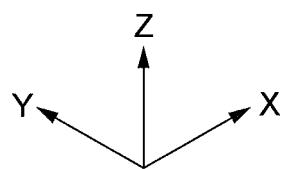

SEMICONDUCTOR LASER DEVICE

TECHNICAL FIELD

The present invention relates to a semiconductor laser device which includes a heat sink.

BACKGROUND ART

Conventional semiconductor laser devices are disclosed, for example, in Patent Literature 1, Patent Literature 2, and Patent Literature 3.

Disclosed in Patent Literature 1 is a semiconductor laser module which has a semiconductor laser bar with two surfaces sandwiched between metal sub-mounts. The sub-mounts can be made of Mo, W, Cu, Cu—W alloy, Cu—Mo alloy, SiC, or AlN. Each of the sub-mounts has a thickness of 50 to 200 µm. In this semiconductor laser device, the semiconductor laser module is mounted onto a liquid-cooled heat sink. This makes it possible to correct warpage of the semiconductor laser bar.

Disclosed in Patent Literature 2 is a semiconductor laser device which has a semiconductor laser bar mounted on a heat sink and which has a reinforcement member affixed onto the same surface as the surface of the heat sink on which the semiconductor laser bar is mounted. The reinforcement member is made of a material having a low linear expansion coefficient. The reinforcement member is made of a material selected from the group consisting of Cu, Al, Ni, W, Mo, Fe, Cr, Co, and Bi.

Disclosed in Patent Literature 3 is a semiconductor laser device which has a liquid-cooled heat sink coated with a resin layer and a semiconductor laser bar mounted thereon. This Literature discloses a structure which is capable of providing an enhanced cooling efficiency and preventing corrosion and water leakage.

CITATION LIST

Patent Literature

[Patent Literature 1] Japanese Patent Application Laid-Open No. 2007-73549
[Patent Literature 2] Japanese Patent Application Laid-Open No. 2007-73549
[Patent Literature 3] Japanese Patent No. 4002234

SUMMARY OF INVENTION

Technical Problem

However, when a semiconductor laser module is combined with a high-quality liquid-cooled heat sink, in particular, when a plurality of semiconductor laser modules are used to form a semiconductor laser stack, the warpage of the semiconductor laser module itself should be restrained by means of the sub-mounts. Nevertheless, a phenomenon of deterioration in light emission property was observed in which the light emission point positions from the semiconductor laser module were arrayed on a curve which was slightly displaced from the designed straight line, whereby an intended light emission distribution could not be obtained.

The present invention was developed in view of such a problem. It is therefore an object of the present invention to provide a semiconductor laser device which is capable of restraining deterioration in light emission property.

Solution to Problem

The inventors of the present application intensively made close studies of the cause of deterioration in the properties of the semiconductor laser device. A pair of sub-mounts made of a Cu—W alloy having a low linear expansion coefficient was adopted, and the pair was used to sandwich the semiconductor laser bar. It would thus be the case that the light emission point positions would not be changed in principle. However, although recent high-quality liquid-cooled heat sinks have been improved in cooling efficiency and reduced in size, their reduced thicknesses may cause the heat sink to be bent also in the thickness direction when the heat sink is expanded or contracted. In this case, the difference in linear expansion coefficient between the laser module, which is primarily high in rigidity, and the high-quality heat sink leads to stress occurring between the laser module and the heat sink, causing the heat sink to be bent and deformed in the thickness direction. The inventors of the present application found that the dislocation of the light emission point position was caused by such a high-performance heat sink.

In order to solve the aforementioned problems, a semiconductor laser device according to the present invention is characterized by including the following: a semiconductor laser bar having a plurality of light emission points arrayed on a straight line; a plate-shaped liquid-cooled heat sink in which a fluid passage is formed and which has a thickness equal to or less than 3 mm; a first sub-mount which is fixed onto one surface of the semiconductor laser bar, made of a material having a linear expansion coefficient less than that of the heat sink, and fixed onto the heat sink; a second sub-mount which is fixed onto the other surface of the semiconductor laser bar and made of a material having a linear expansion coefficient less than that of the heat sink; and a molybdenum reinforcement member fixed onto a position on a surface of the heat sink opposite to the surface on which the first sub-mount is mounted, the position being opposed to the first sub-mount, the molybdenum reinforcement member having a linear expansion coefficient less than that of the heat sink and a thickness of 0.1 to 0.5 mm.

According to the semiconductor laser of the present invention, the liquid-cooled heat sink has a high performance. However, as mentioned above, when being reduced in thickness, the heat sink tends to be bent due to the difference in linear expansion coefficient between the heat sink and the laser module (the semiconductor laser bar+the sub-mounts). However, the molybdenum reinforcement member having a low linear expansion coefficient is fixed onto the side opposite to the laser module. This leads to a tendency to cancel out the force caused by the stress from the laser module side to bend the heat sink and the force caused by the stress from the molybdenum reinforcement member side to bend the heat sink. Furthermore, the molybdenum reinforcement member mounted onto the heat sink also contributes to an improvement in the rigidity of the entire assembly. Thus, according to the semiconductor laser device of the present invention, it is possible to restrain the bending of the heat sink, the displacement of the light emission point position, and deterioration in light emission property.

Note that although the molybdenum reinforcement member refers to a reinforcement member which is predominantly composed of molybdenum (80% or greater in weight percentage), the same effects can be provided even when the reinforcement member is mixed with a trace amount of impurities.

In order to solve the aforementioned problems, a semiconductor laser device according to the present invention may have a plurality of semiconductor laser units stacked in layers. The semiconductor laser device is characterized in that the individual semiconductor laser unit includes the following: a plate-shaped liquid-cooled heat sink in which a fluid passage is formed; a semiconductor laser module made up of a semiconductor laser bar and fixed onto one surface side of the heat sink; and a molybdenum reinforcement member fixed onto a position on the other surface of the heat sink, the position being opposed to the semiconductor laser module, the molybdenum reinforcement member having a thickness of 0.1 to 0.5 mm and a linear expansion coefficient less than that of the heat sink. The semiconductor laser device is also characterized in that one surface of the molybdenum reinforcement member of one of the semiconductor laser units is fixed onto the heat sink of the same semiconductor laser unit, and the other surface is fixed onto the semiconductor laser module of another semiconductor laser unit.

According to the semiconductor laser of the present invention, the liquid-cooled heat sink has a high performance. However, as mentioned above, when having been reduced in thickness, the heat sink tends to be bent due to the difference in linear expansion coefficient between the heat sink and the laser module (the semiconductor laser bar+the sub-mounts). However, it was found that with the laser module stacked in layers, the molybdenum reinforcement member having a low linear expansion coefficient was fixed onto the side opposite to the laser module, thereby allowing the rigidity of the entire assembly to be considerably improved. In particular, with all semiconductor laser units stacked in layers, and with a thermally melted adhesive layer disposed between components when the adhesive layer exists between each component, the rigidity of the entire assembly is considerably improved when they are fixed by simultaneously applying heat thereto. Thus, according to the semiconductor laser device of the present invention, it is possible to restrain the bending of the heat sink, the displacement of the light emission point position, and deterioration in light emission property.

Note that the molybdenum reinforcement member refers to a reinforcement member which is predominantly composed of molybdenum (80% or greater in weight percentage), but can provide the same effects even when being mixed with a trace amount of impurities.

In order to solve the aforementioned problems, a semiconductor laser device according to the present invention may have a plurality of semiconductor laser units stacked in layers. The semiconductor laser device is characterized in that the individual semiconductor laser unit includes the following: a plate-shaped liquid-cooled heat sink in which a fluid passage is formed; a semiconductor laser module made up of a semiconductor laser bar and fixed onto one surface of the heat sink; and a molybdenum reinforcement member fixed onto a position on the other surface side of the heat sink, the position being opposed to the semiconductor laser module, the molybdenum reinforcement member having a thickness of 0.1 to 0.5 mm having a linear expansion coefficient less than that of the heat sink. The semiconductor laser device is also characterized in that one surface of the molybdenum reinforcement member of one of the semiconductor laser units is fixed onto the heat sink of the same semiconductor laser unit, and the other surface is fixed onto the semiconductor laser module of another semiconductor laser unit.

According to the semiconductor laser of the present invention, the liquid-cooled heat sink has a high performance. However, as mentioned above, when having been reduced in thickness, the heat sink tends to be bent due to the difference in linear expansion coefficient between the heat sink and the laser module (the semiconductor laser bar+the sub-mounts). However, it was found that with the laser module stacked in layers, the molybdenum reinforcement member having a low linear expansion coefficient was fixed onto the side opposite to the laser module, thereby allowing the rigidity of the entire assembly to be considerably improved. In particular, with all semiconductor laser units stacked in layers, and with a thermally melted adhesive layer disposed between components when the adhesive layer exists between each component, the rigidity of the entire assembly is considerably improved when they are fixed by simultaneously applying heat thereto. Thus, according to the semiconductor laser device of the present invention, it is possible to restrain the bending of the heat sink, the displacement of the light emission point position, and deterioration in light emission property.

Advantageous Effects of Invention

According to the semiconductor laser device of the present invention, it is possible to restrain deterioration in light emission property.

BRIEF DESCRIPTION OF DRAWINGS

FIG. 5 is a perspective view illustrating a semiconductor laser bar;

DESCRIPTION OF EMBODIMENTS

Hereinafter, an explanation will be given of a semiconductor laser device according to an embodiment. Note that the same components will be denoted with the same reference sign and will not be repeatedly explained.

Figure 1:
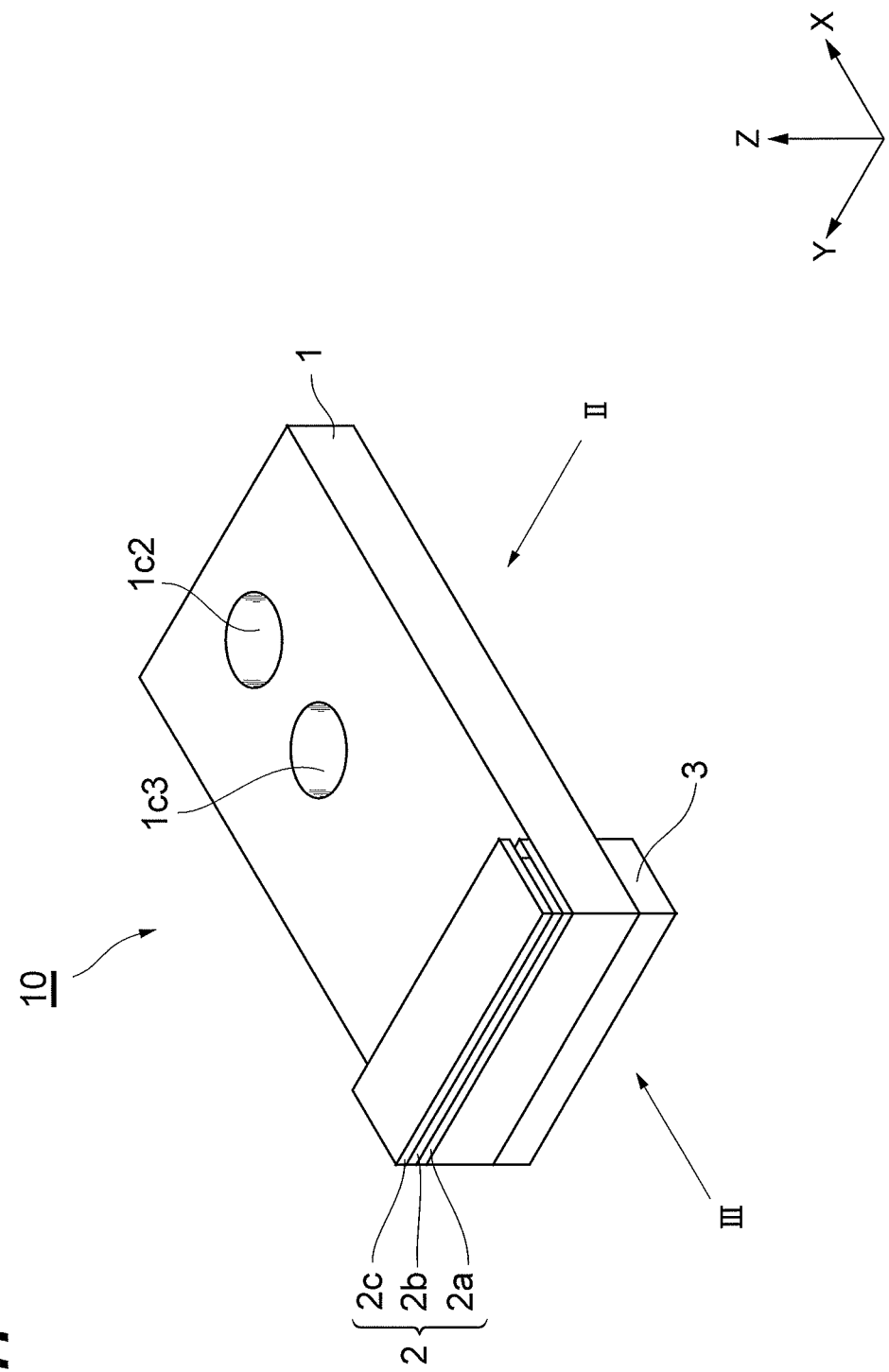
FIG. 1 is a perspective view illustrating a semiconductor laser device.
Figure 2:
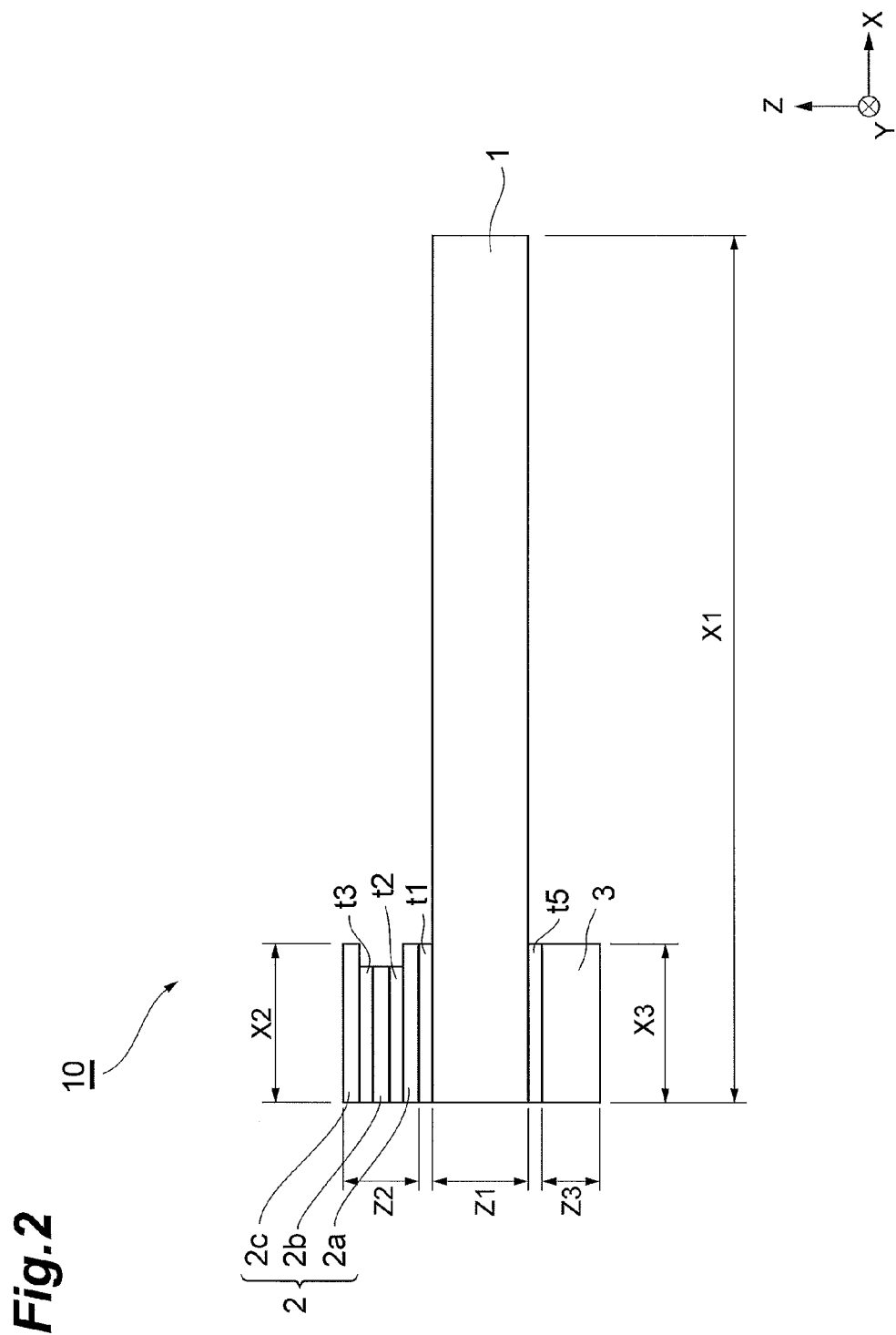
FIG. 2 is a side view illustrating a semiconductor laser device when viewed from the direction of an arrow II.
Figure 3:
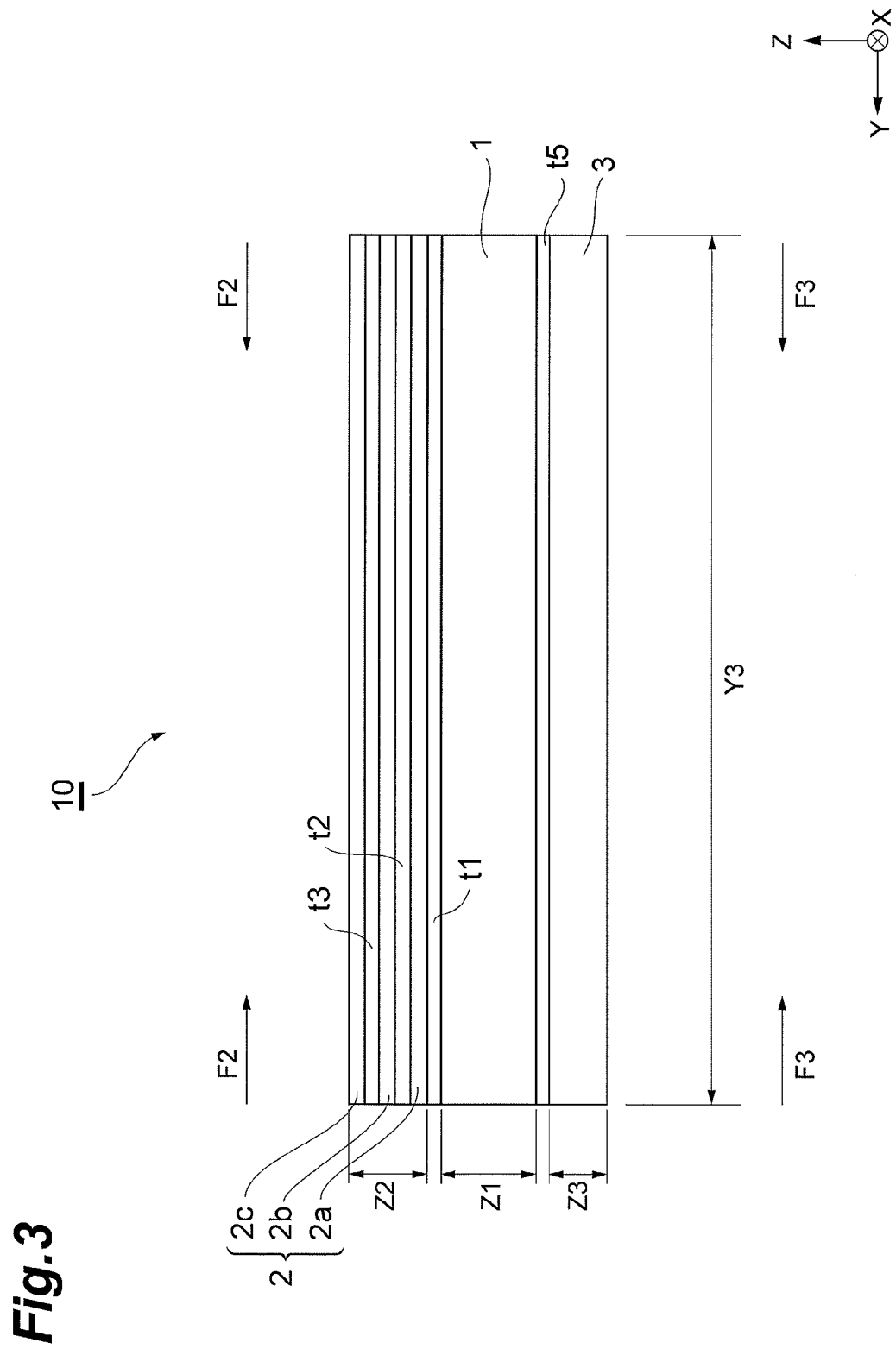
FIG. 3 is a front view illustrating a semiconductor laser device when viewed from the direction of an arrow III.

FIG. 1 is a perspective view illustrating a semiconductor laser device; FIG. 2 is a side view illustrating the semiconductor laser device when viewed from the direction of an arrow II; and FIG. 3 is a front view illustrating the semiconductor laser device when viewed from the direction of an arrow III.

This semiconductor laser device 10 includes a heat sink 1, a laser module 2 fixed onto the heat sink 1, and a reinforcement member 3 fixed onto a position on the heat sink 1 opposed to the laser module 2, and can also include, as required, a coating member on the upper surface of the heat sink 1 with an adhesive layer disposed therebetween. Such a coating member functions also as a sealing material when a cooling medium such as water is introduced into the heat sink. As required, for example, an O-ring is disposed around openings 1c2 and 1c3.

Figure 6:
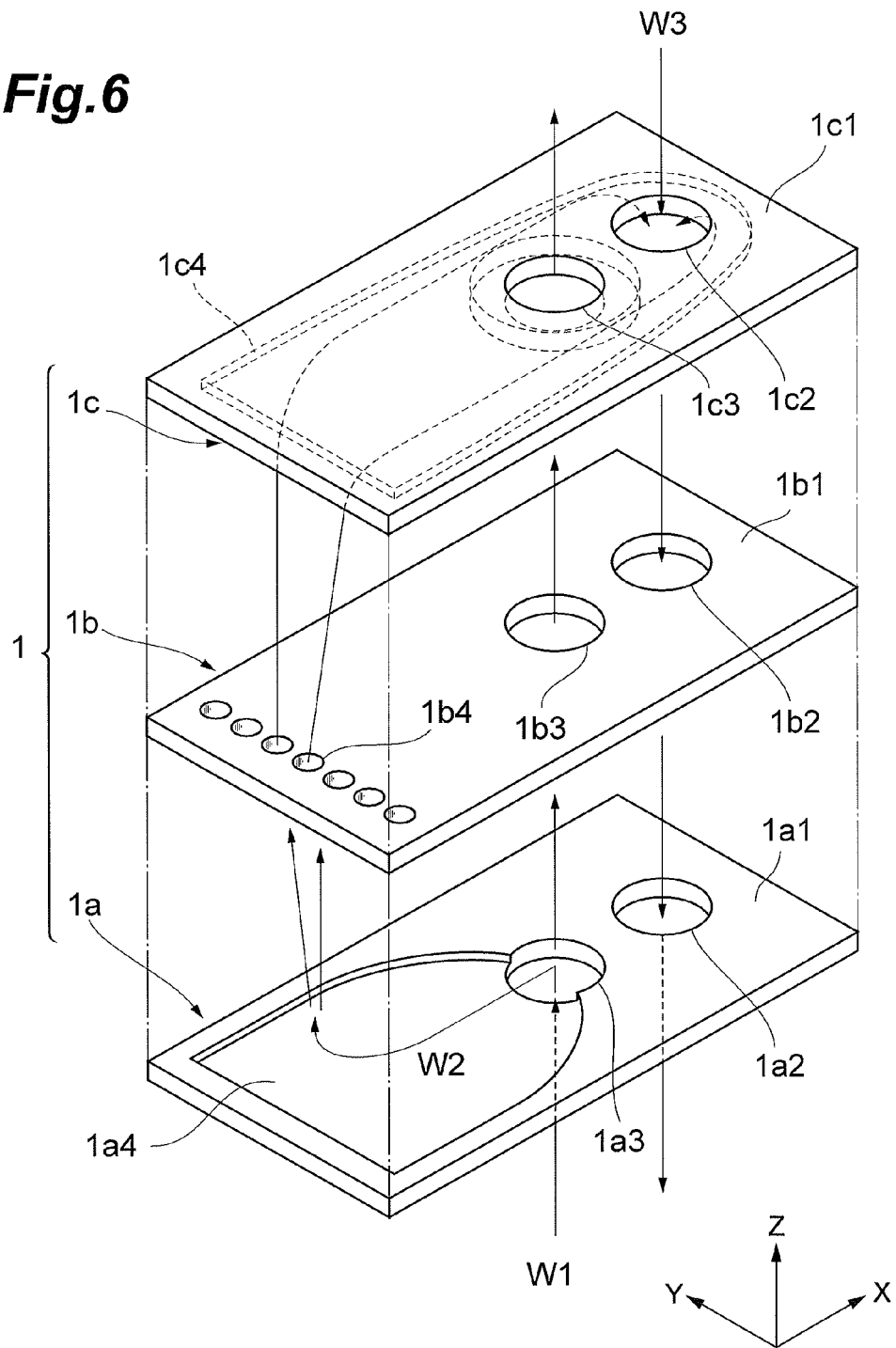
FIG. 6 is an exploded perspective view illustrating a liquid-cooled heat sink.

The heat sink 1 is a plate-shaped liquid-cooled heat sink in which a fluid passage is formed. Furthermore, the heat sink 1 is 3 mm or less in thickness Z1, and thus allowed to be bent in the thickness direction when being adopted singly. The detailed structure of the heat sink 1 is illustrated in FIG. 6, to be described later.

The laser module 2 has a semiconductor laser bar 2b which is sandwiched between a first sub-mount 2a and a second sub-mount 2c. The first sub-mount 2a is fixed onto the upper surface of the heat sink 1 with an adhesive layer t1 interposed therebetween, and as well fixed onto the semiconductor laser bar 2b with an adhesive layer t2 interposed therebetween. Furthermore, the semiconductor laser bar 2b is fixed onto the second sub-mount 2c with an adhesive layer t3 interposed therebetween. That is, the first sub-mount 2a is fixedly adhered to one surface of the semiconductor laser bar 2b, while the second sub-mount 2c is fixedly adhered to the other surface of the semiconductor laser bar 2b. Note that each of the sub-mounts 2a and 2c is made of a material having a linear expansion coefficient (thermal expansion coefficient) which is less than the linear expansion coefficient of the heat sink 1, or has the shape of a plate (rectangular parallelepiped).

The sub-mounts 2a and 2c can be made of a material selected from the group consisting of Mo, W, Cu, Cu—W alloy, Cu—Mo alloy, SiC, or AlN, and each sub-mount can be made 50 to 200 μm in thickness.

The reinforcement member 3 is made up of a molybdenum (Mo) plate and fixed onto a position on a surface of the heat sink 1 opposite to the surface on which the first sub-mount is mounted, the position being opposed to the first sub-mount 2a, with an adhesive layer t5 interposed between the heat sink 1 and the reinforcement member 3. The reinforcement member 3 is made of a material having a linear expansion coefficient less than that of the heat sink 1, and unlike the sub-mounts, falls within the range of 0.1 to 0.5 mm in thickness. Note that the molybdenum reinforcement member 3 refers to a reinforcement member which is predominantly composed of molybdenum (80% or greater in weight percentage), but can provide the same effects even when being mixed with a trace amount of impurities.

Here, the sub-mounts are preferably made of a Cu—W alloy, more preferably of the reinforcement member 3 molybdenum. One reason for this is that the effect of canceling out the stress imposed on the heat sink 1 when being expanded or contracted is available, while another reason is that the following effects are also available. That is, since the Cu—W alloy has a good thermal conductivity and an expansion coefficient closer to that of the semiconductor laser bar, the Cu—W alloy is advantageous as the sub-mount of the semiconductor laser bar. Furthermore, since the feature as an electrode is also required of the sub-mount, the sub-mount is made of metal also in order to provide electrical conduction.

In a three-dimensional XYZ rectangular coordinate system, assuming that the Y-axis is the direction in which light emission points are aligned (the longitudinal direction of the laser bar), the Z-axis is the direction of the thickness of the laser bar 2b, and the X-axis is parallel to the direction in which a laser beam is emitted, the exemplary dimensions (the preferred ranges) of each component are as follows:

(1) Dimensions of the Heat Sink 1
X direction length X1: 30 mm (10 mm to 30 mm)
Y direction length Y1 (=Y3 in this example): 12 mm (10 mm to 12 mm)
Z direction length Z1: 1.1 mm (1 mm to 3 mm)

(2) Dimensions of the Semiconductor Laser Module 2
X direction length X2: 2 mm (1 mm to 5 mm)
Y direction length Y2 (=Y3 in this example): 10 mm (5 mm to 12 mm)
Z direction length Z2: 450 μm (300 μm to 600 μm)
Thickness Z3a of the sub-mount 2a: 150 μm (100 μm to 300 μm)
X direction length of the sub-mount 2a=X2
Y direction length of the sub-mount 2a=Y2 (=Y3)
Thickness Z3c of the sub-mount 2c: 150 μm (100 μm to 300 μm)
X direction length of the sub-mount 2c=X2
Y direction length of the sub-mount 2c=Y2 (=Y3)
Thickness Z3c of the semiconductor laser bar 2b: 140 μm (100 μm to 150 μm)
X direction length X2b of the semiconductor laser bar 2b: 2 mm (1 mm to 5 mm)

Note that in this example, it holds that X2b<X2. This is to ensure a region for providing a power supply line on the sub-mount. Y direction length Y2b of the semiconductor laser bar 2b=Y2 (=Y3)

(3) Dimensions of the Reinforcement Member 3
X direction length X3: 2 mm (1 mm to 5 mm)
Y direction length Y3: 10 mm (5 mm to 12 mm)
Z direction length Z3: 150 μm (100 μm to 500 μm)

Note that all the adhesive layers t1, t2, t3, and t5 are made of solder material, each having a thickness Zt. The adhesive layers to be adopted may be made of SnAgCu or AuSn; however, the layers t2 and t3 can be made of AuSn and the layers t1 and t5 of SnAgCu. An exemplary dimension of the thickness Zt is 10 μm, preferably within the range of 3 to 20 μm. The effects of the aforementioned numerical range can be explained as follows. That is, for the numerical range from 3 to 20 μm, the solder is spread across the entire layer, without overflowing therefrom, so as to provide uniform bonding.

Here, the physical quantities of the liquid-cooled heat sink 1, the first sub-mount 2a, the semiconductor laser bar 2b, the second sub-mount 2c, and the molybdenum reinforcement member 3 are adjusted so as to substantially eliminate the bending of the semiconductor laser bar.

Figure 4:
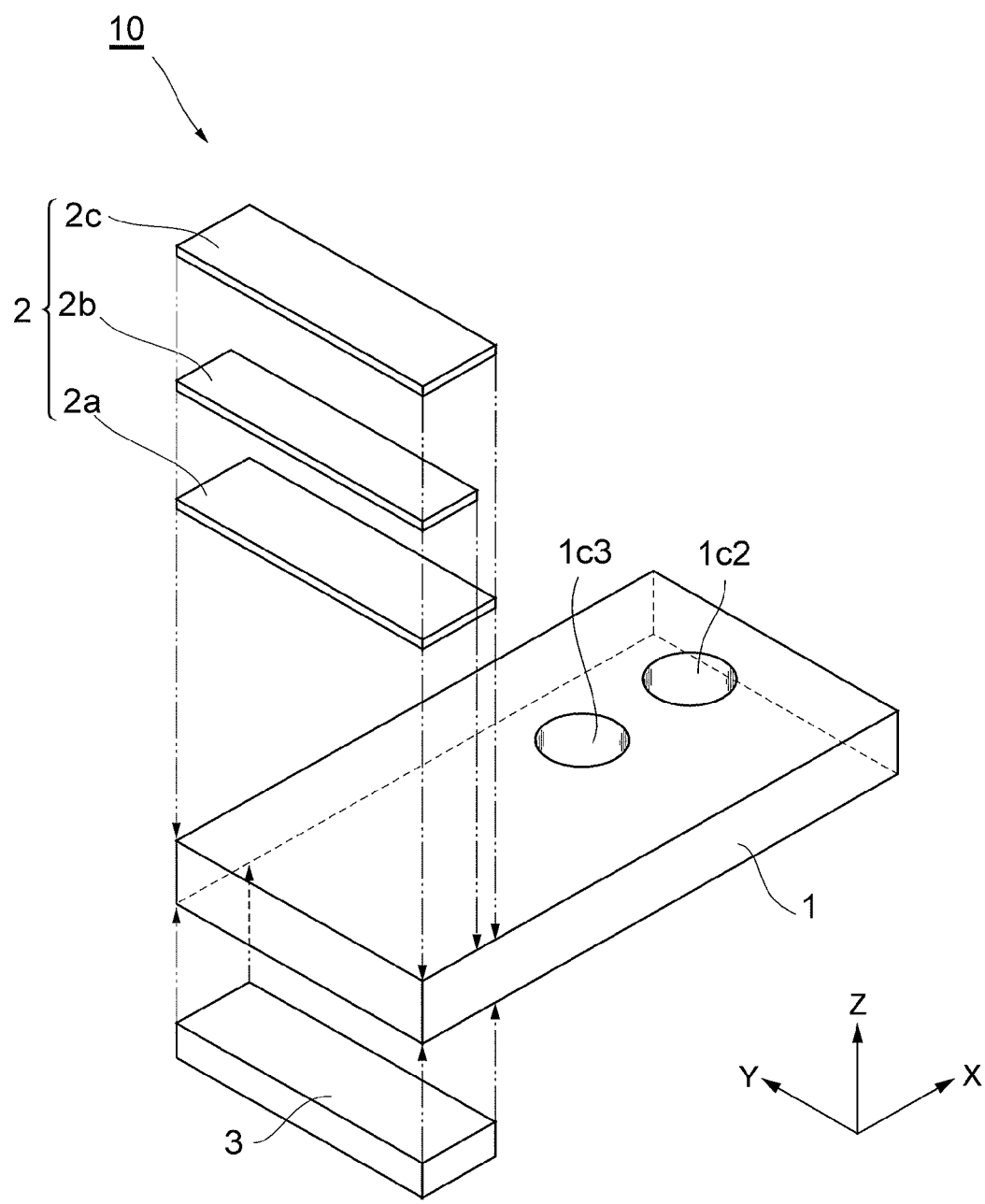
FIG. 4 is an exploded perspective view illustrating a semiconductor laser device.

FIG. 4 is an exploded perspective view illustrating the semiconductor laser device.

The heat sink 1 has the openings (through holes) 1c2 and 1c3 to introduce a cooling medium, which may communicate with an opening (through hole) of a coating member that can be provided on the heat sink 1. The coating member is provided as required, and allowed to function to seal the cooling medium as well as to function as a spacer when being incorporated into an external apparatus.

The laser module 2 is disposed on the upper surface of the heat sink 1 with an adhesive layer interposed therebetween, and the reinforcement member 3 is disposed on the rear surface side with an adhesive layer interposed therebetween.

Then, heat and pressure are applied at the same time to these components in the Z-axis direction, and after that, the components are cooled to room temperature to be thereby fixed. The temperature should be just enough to melt the adhesive layers. As required, an appropriate coating member is disposed on the upper surface of the heat sink 1 with an adhesive layer interposed therebetween, and then heat and pressure are applied thereto in the same manner to thereby fix the same.

FIG. 5 is a perspective view illustrating the semiconductor laser bar.

The laser bar 2$b$ has a plurality of light emission points 2$b$2 disposed along a straight line on the Y-axis. The laser bar 2$b$ which is made up of a compound semiconductor substrate 2$b$1 is adopted to have an active layer at the position of the light emission point 2$b$2 and cladding layers disposed on both sides thereof. The compound semiconductor is made of a known material such as GaN, AlGaAs, GaN, or AlGaN, or a mixed crystal with In mixed therewith. In this example, it is assumed that the laser bar 2$b$ is predominantly composed of GaAs, the active layer further contains In, and the cladding layers disposed on both sides thereof also contain Al. Note that since GaAs and Cu—W alloy have close thermal expansion coefficients, the stress between the sub-mounts and the laser bar is low.

Here, an explanation will be given of the liquid-cooled heat sink 1 which has a high performance.

FIG. 6 is an exploded perspective view illustrating the liquid-cooled heat sink.

The heat sink 1 is made up of three metal (Cu in this example) plate-shaped members 1$a$1, 1$b$1, and 1$c$1 which are stacked in layers and then fixed.

The lowermost plate-shaped member 1$a$1 has two openings (through holes) 1$a$2 and 1$a$3, and a recessed portion 1$a$4 which defines a flow channel in conjunction with the lower surface of plate-shaped member 1$b$1 located on the upper side thereof. The recessed portion 1$a$4 continues to the opening 1$a$3.

The plate-shaped member 1$b$1 at the center has two openings (through holes) 1$b$2 and 1$b$3, and a plurality of through holes 1$b$4 which constitute the flow channel. The through holes 1$b$4 are located so as to be opposed to the recessed portion 1$a$4.

The plate-shaped member 1$c$1 located on the top has the two openings (through holes) 1$c$2 and 1$c$3, and a recessed portion 1$c$4 which constitutes the flow channel in conjunction with the upper surface of plate-shaped member 1$b$1 located on the lower side thereof. The recessed portion 1$c$4 continues to the opening 1$c$2 but not to the opening 1$c$3.

When being introduced into the heat sink 1 in the direction of an arrow W1 which points upwardly from below, the cooling medium can pass upwardly through the group of the openings 1$a$3, 1$b$3, and 1$c$3 which communicate with each other. It is also possible for the cooling medium to pass through the flow channel, which is defined by the recessed portion 1$a$4, the through holes 1$b$4, and the recessed portion 1$c$4 to reach the opening 1$c$2 as shown by an arrow W2. The cooling medium introduced into the heat sink 1 through the opening 1$c$2 along an arrow W3 can also pass downwardly through the group of the openings 1$c$2, 1$b$2, and 1$a$2 which communicate with each other. Note that the plate-shaped member is made of a metal such as Cu and has the surface of which is coated with a resin layer so as to be prevented from being corroded.

Figure 7:
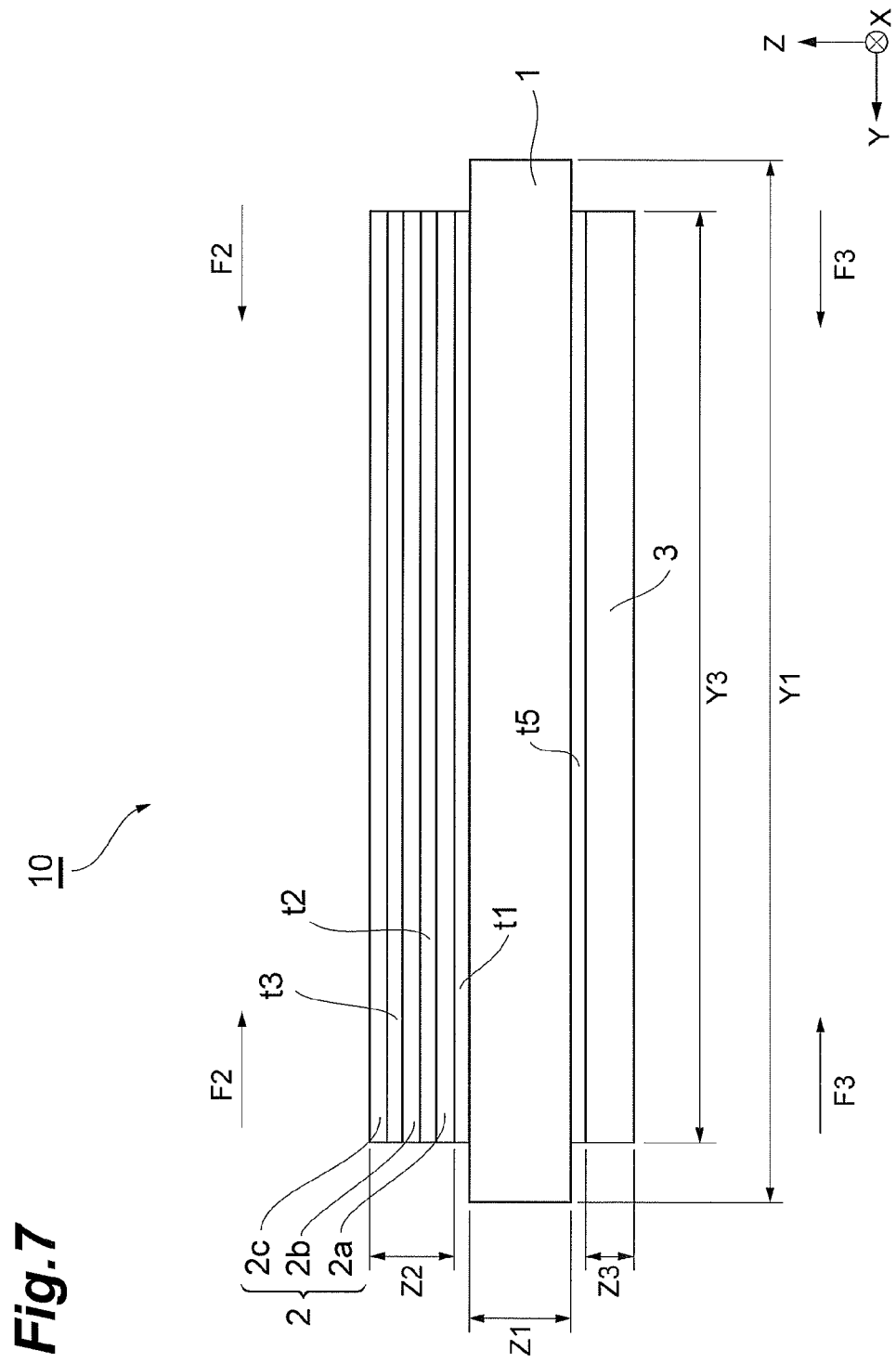
FIG. 7 is a front view illustrating a semiconductor laser device with a heat sink increased in dimension in the width direction.

FIG. 7 is a front view illustrating a semiconductor laser device with a heat sink increased in dimension in the width direction.

In the aforementioned description, the Y direction length Y1 of the heat sink 1 is consistent with the Y direction length Y3 of the reinforcement member 3; however, as illustrated in the figure, Y1 may be greater than Y3. Furthermore, the X direction length of the heat sink 1 may be greater than that of the aforementioned embodiment. Even in this case, the same effects as those of the aforementioned embodiment are also available.

Figure 8:
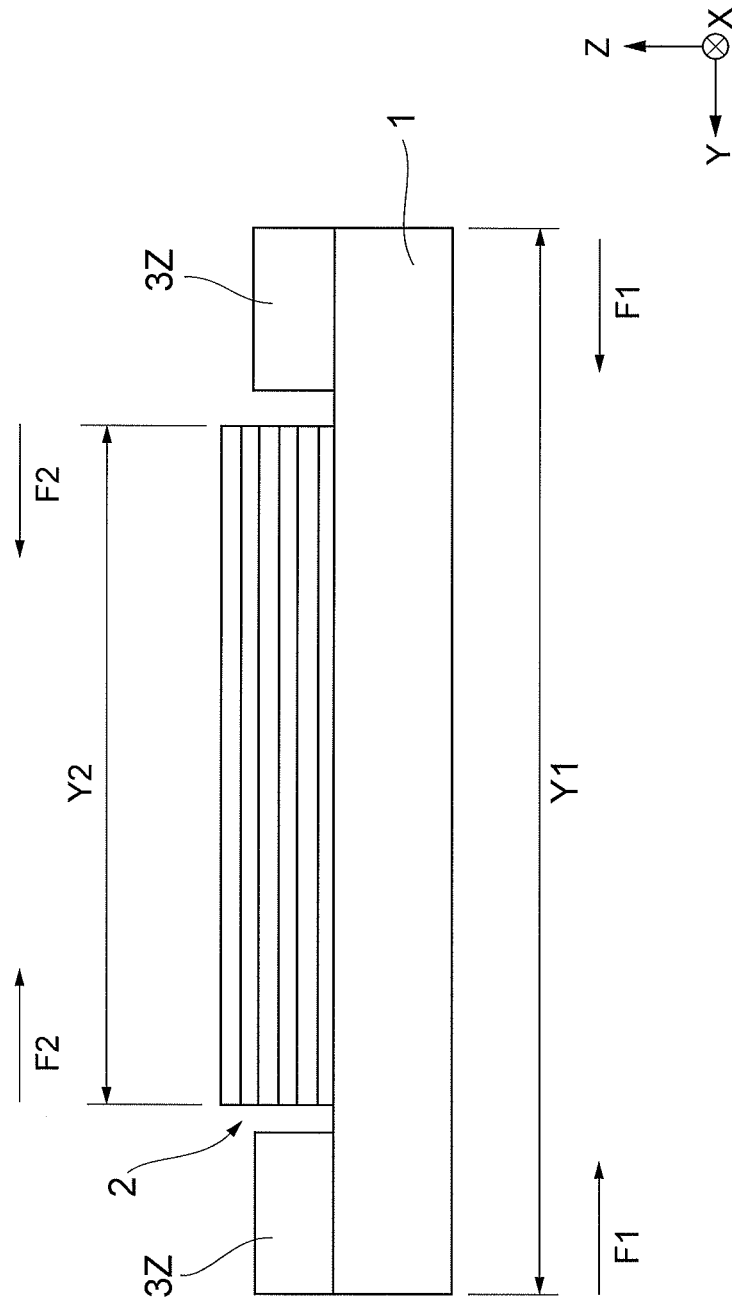
FIG. 8 is a front view illustrating a semiconductor laser device as a comparative example.

FIG. 8 is a front view illustrating a semiconductor laser device as a comparative example.

In the comparative example, the semiconductor laser device of the embodiment shown in FIG. 3 was modified in a manner such that the mounting position of the reinforcement member 3 was changed to the both sides on the upper surface of the heat sink 1 so as to form reinforcement members 3Z. The structure of the other components of the comparative example is the same as that of those shown in FIG. 3.

The aforementioned liquid-cooled heat sink such as a water-cooled heat sink has a high performance. However, when having been reduced in thickness, the liquid-cooled heat sink tends to be bent due to the difference in linear expansion coefficient between the heat sink and the laser module 2.

In the case of the comparative example, when the heat sink 1 is cooled, force is applied to the heat sink 1 to contract the same in the direction of an arrow F1. However, since the semiconductor laser module 2 is less than the heat sink 1 in linear expansion coefficient, force acts upon the laser module 2 to contract the same in the direction of an arrow F2. That is, due to the difference in linear expansion coefficient therebetween, the heat sink 1 tends to be deformed in an upwardly convex manner. As a matter of course, since the reinforcement members 3Z are fixed, the expansion or contraction of the heat sink 1 will be slightly alleviated; however, the entire deformation cannot be restrained.

On the other hand, as with the embodiment shown in FIG. 3, the molybdenum reinforcement member 3 having a lower linear expansion coefficient is fixed to the side opposite to the side on which the laser module 2 is mounted. This leads to a tendency to cancel out the force which acts on the heat sink 1 as the stress (the force denoted by the arrow F2) from the laser module 2 side to bend the same and the force which acts on the heat sink 1 as the stress (the force denoted by an arrow F3) from the reinforcement member 3 side to bend the same. Furthermore, the reinforcement member 3 mounted onto the heat sink 1 provides an improved rigidity to the entire assembly. Thus, according to the semiconductor laser device 10 of the embodiment, the bending of the heat sink 1 is restrained and the displacement of the light emission point positions is restrained, thus restraining deterioration in light emission property.

Furthermore, in the case of the aforementioned structure, since the deformation of the heat sink 1 is restrained, it is possible to restrain water leakage from the heat sink 1. Furthermore, when a power supply line to the laser is attached to the sub-mounts (power is supplied between the sub-mounts sandwiching the semiconductor laser bar when the laser is activated), it is possible to restrain the supply line from being dislodged. Furthermore, when a lens is disposed in front of the semiconductor laser device, it is possible to yield a high-precision product because the light emission point positions are not dislocated. When a semiconductor laser device was prepared in the aforementioned exemplary dimensions, the amount of bending of the heat sink 1 was made 1.5 µm or less with good reproducibility, thus making it possible to prepare a semiconductor laser device which is capable of restraining deterioration in light emission property.

Figure 9:
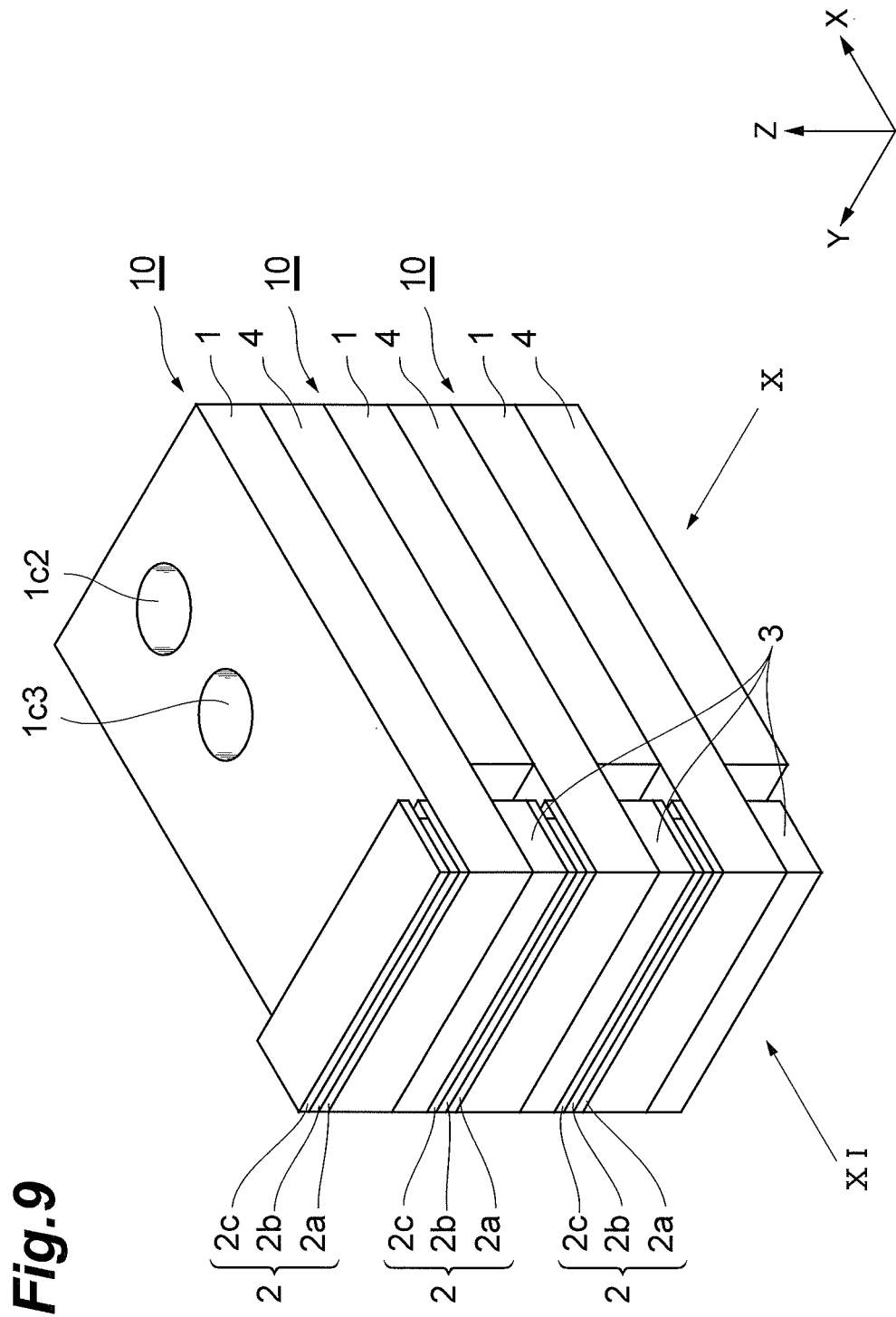
FIG. 9 is a perspective view illustrating a semiconductor laser device.
Figure 10:
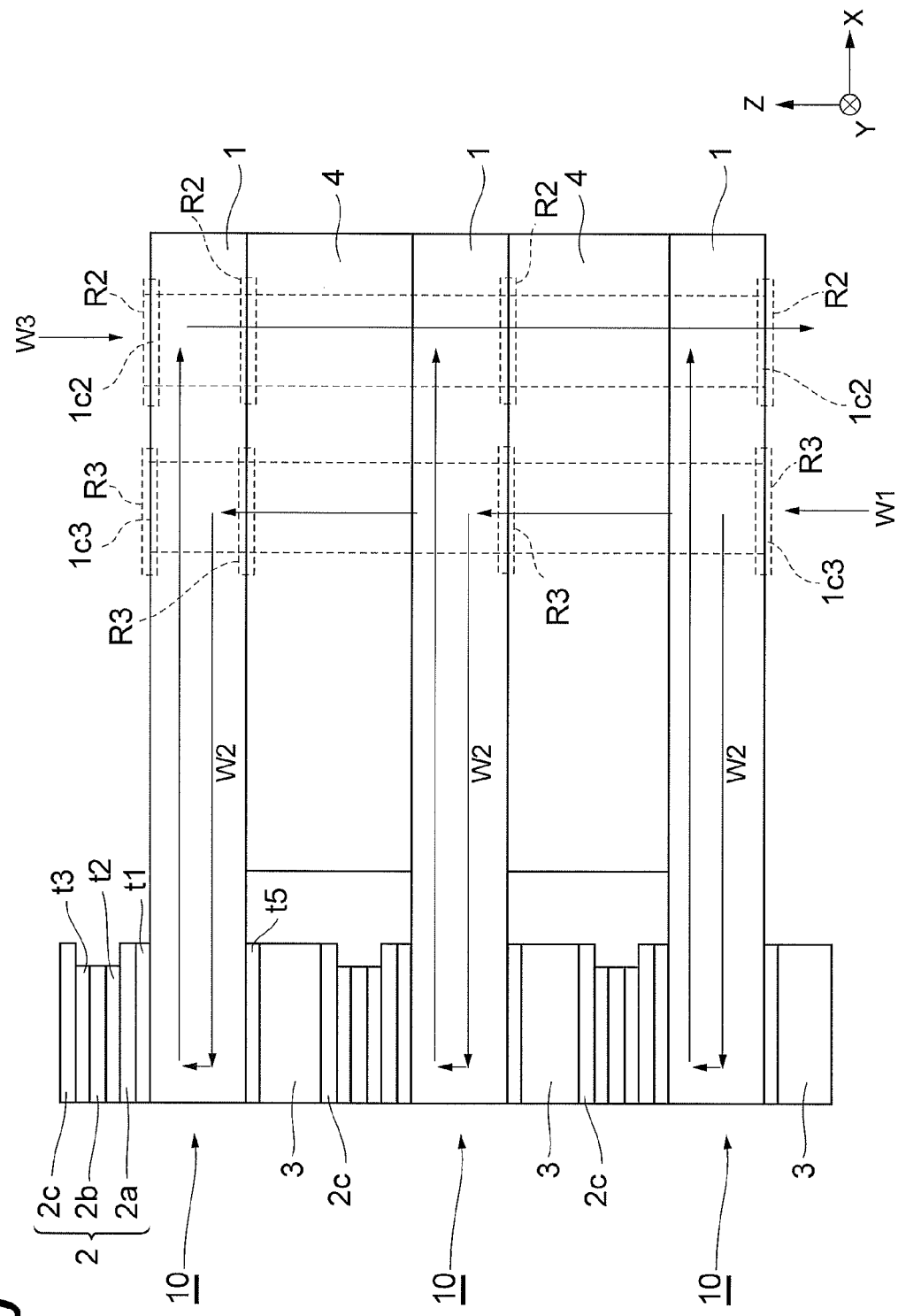
FIG. 10 is a side view illustrating a semiconductor laser device when viewed from the direction of an arrow X.
Figure 11:
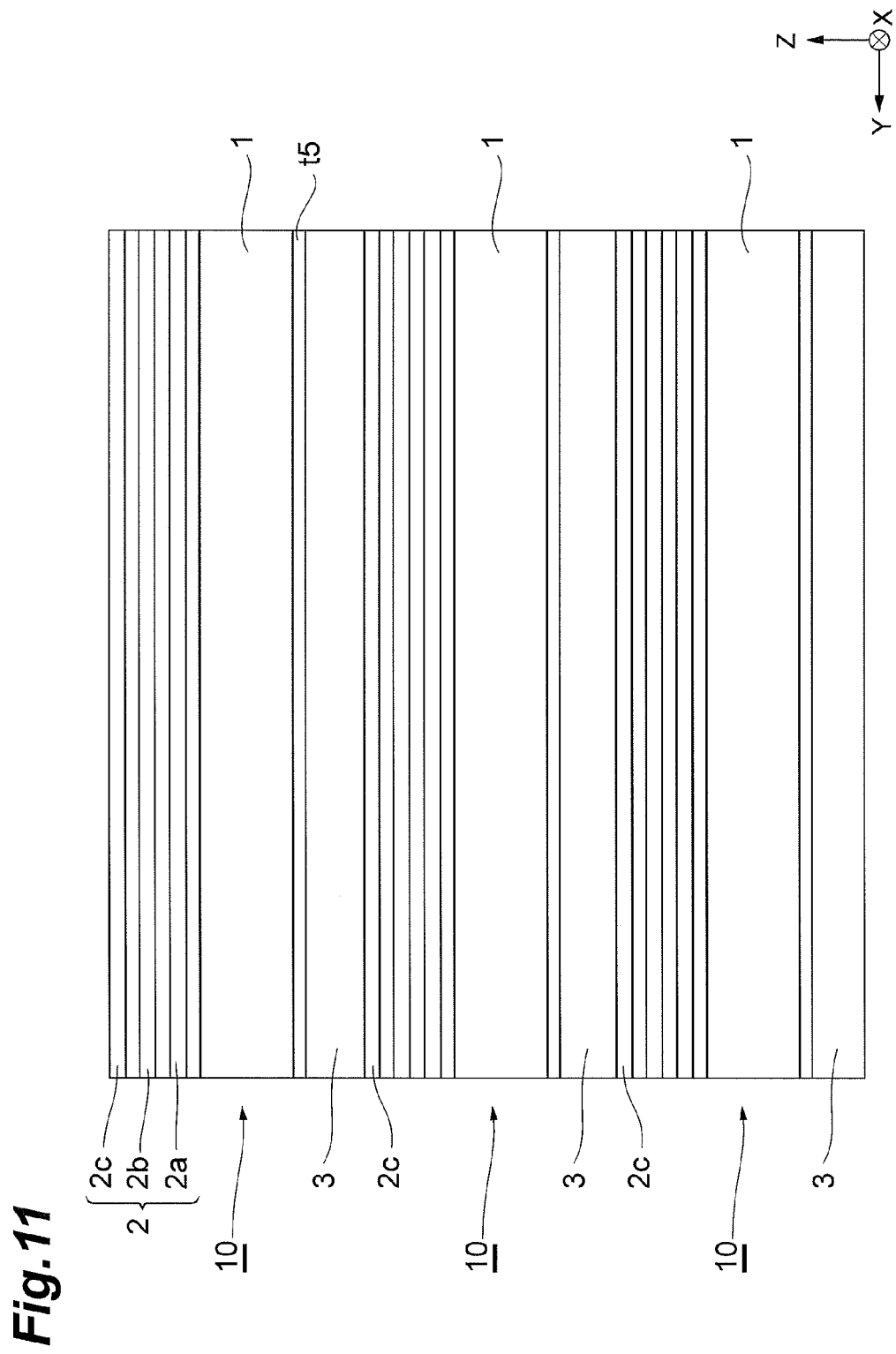
FIG. 11 is a front view illustrating a semiconductor laser device when viewed from the direction of an arrow XI.

FIG. 9 is a perspective view illustrating a semiconductor laser device with a plurality of semiconductor laser units 10 stacked in layers; FIG. 10 is a side view illustrating the semiconductor laser device when viewed from the direction of an arrow X; and FIG. 11 is a front view illustrating the semiconductor laser device when viewed from the direction of an arrow XI.

This semiconductor laser device is, what is called, a semiconductor laser stack, with a plurality of semiconductor laser units 10 stacked in layers along the Z-axis. The figures show an example with three semiconductor laser units 10 stacked in layers; however, two or four or more semiconductor laser units 10 may also be stacked in layers.

Figure 12:
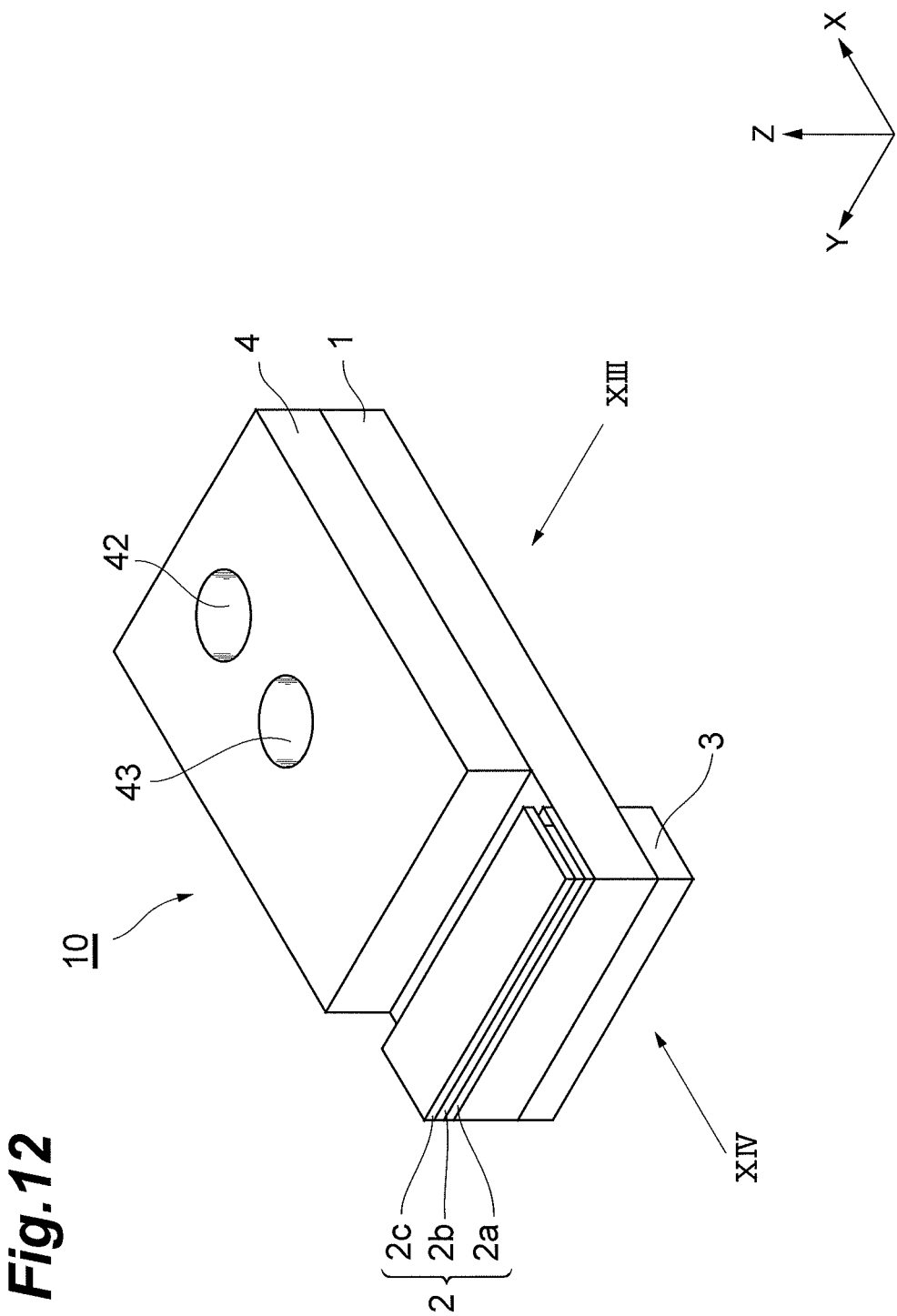
FIG. 12 is a perspective view illustrating a semiconductor laser unit.

As shown in the detailed structure in FIG. 12 and the subsequent figures, the individual semiconductor laser unit 10 includes the heat sink 1, the semiconductor laser module 2, and the reinforcement member 3 made of molybdenum, with a spacer 4 interposed between the semiconductor laser units 10, the spacer 4 having a fluid passage therein.

The heat sink 1 is a plate-shaped liquid-cooled heat sink in which a fluid passage is formed, and has such a rigidity as to be bent in the thickness direction when being adopted singly. The semiconductor laser module 2 includes the semiconductor laser bar 2b at the center and is fixed onto the upper surface of the heat sink 1 (one surface) side. The reinforcement member 3 is fixed onto a position on the lower surface (the other surface) side of the heat sink 1, the position being opposed to the semiconductor laser module 2, and has a linear expansion coefficient less than that of the heat sink 1. The thickness of the individual reinforcement member 3 is 0.1 to 0.5 mm. Each unit 10 is reinforced by the molybdenum and thereby restrained from being bent, and the units 10 are stacked in layers and pressure is applied thereto. Note that the units 10 are not bonded to each other with solder, but are brought into contact by pressure from above being applied thereto.

There is an advantage of the heat sink 1 itself being resistant to distortion because the amount of expansion or contraction of one heat sink 1 depending on temperature is restricted by the reinforcement member 3 having a lower linear expansion coefficient. The semiconductor laser unit 2 is thus restrained from being bent due to the distortion of the heat sink 1. As a matter of course, in particular, with attention being focused on a semiconductor laser unit 10 located on other than the both ends in the vertical direction (e.g., one semiconductor laser unit at the center), the semiconductor laser module 2 is in contact with the heat sink 1 located below thereof having restrained expansion or contraction and the reinforcement member 3 located above thereof. Thus, the bending of the semiconductor laser module 2 itself is considerably restrained.

With attention being focused on the semiconductor laser units 10 at the both ends, the stress caused by the difference in thermal expansion coefficient between the heat sink 1 and the reinforcement member 3 located below thereof and the stress caused by the difference in thermal expansion coefficient between the heat sink 1 and the laser module 2 located above thereof act upon the heat sink 1 of the semiconductor laser units 10. Since these stresses act upon the heat sink 1 in the same direction with equal magnitude, these stresses are adopted to cancel out as a whole. Thus, the semiconductor laser modules 2 at the both ends will also be restrained from being bent due to the bending of the heat sink 1.

Moreover, for the semiconductor laser units 10 being stacked in layers, an electrically conductive adhesive layer may be interposed between the reinforcement member 3 of one semiconductor laser unit 10 and the immediately underneath sub-mount 2c; however, in this example, these are assumed to be in contact with each other. Such an adhesive layer is made of the same material as that of the other layers such as the adhesive layer t1. From the viewpoint of a reduction in distortion caused by cooling, the components located on the both sides of the adhesive layer are preferably heated at the same time to be thereby fixed after having been stacked in layers. As a matter of course, after each unit 10 has been completed using each of the adhesive layers t1, t2, t3, and t5 for fixing, the units 10 can be bonded to each other with an adhesive layer interposed therebetween.

The spacer 4, which is interposed between the semiconductor laser units 10, is made of a metal or an electrical insulator. For the spacer 4 made of a metal such as Cu, an insulating material could be adopted for the adhesive layer on the heat sink 1 so as to prevent a short circuit between the semiconductor laser units 10. However, for the spacer 4 made of an electrical insulator such as glass or ceramic, there is no limitation on the material of the adhesive layer. In this example, the spacer 4 is made of silicone resin (rubber) with no adhesive layer interposed between the spacer and the heat sink.

In the case of driving the semiconductor laser stack, a drive current may be supplied between the upper electrode or the sub-mount 2c and the lower electrode or the sub-mount 2a. Each of the sub-mounts are electrically connected to each other through the reinforcement members 3. Thus, in principle, a drive voltage applied between the uppermost sub-mount 2c and the lowermost sub-mount 2a of the entire stack would cause a current to be supplied to all the semiconductor laser bars 2b provided therebetween, allowing a plurality of laser beams to be emitted in the −X direction from the two-dimensional light emission points of each of the semiconductor laser bars 2b.

Each heat sink 1 has the two through holes 1c2 and 1c3 which extend in the thickness direction so as to communicate with through holes 42 and 43 of the spacer 4, respectively. A cooling medium introduced along the arrow W1 through the lowermost through hole 1c3 (see FIG. 10) can pass through the fluid passage in the heat sink 1 and the through hole 43 of the spacer 4 into the uppermost heat sink 1 and through hole 1c3, as shown by the arrows W2 and W1. The cooling medium can also pass through the fluid passage in the heat sink 1 into the through hole 1c2. Most of the cooling medium introduced along the arrow W3 through the uppermost through hole 1c2 can pass through the group of through holes in fluid communication therewith into the lowermost through hole 1c2.

Furthermore, as required, O-rings R2 and R3 are preferably disposed so as to surround each of the through holes 1c2, 1c3, 42, and 43 on the upper and lower surfaces of the heat sink 1 and on the upper surface of the spacer 4 (see FIG. 10), thereby providing enhanced sealability between members in contact therewith.

Next, an explanation will be given of the structure of the individual semiconductor laser unit 10.

Figure 13:
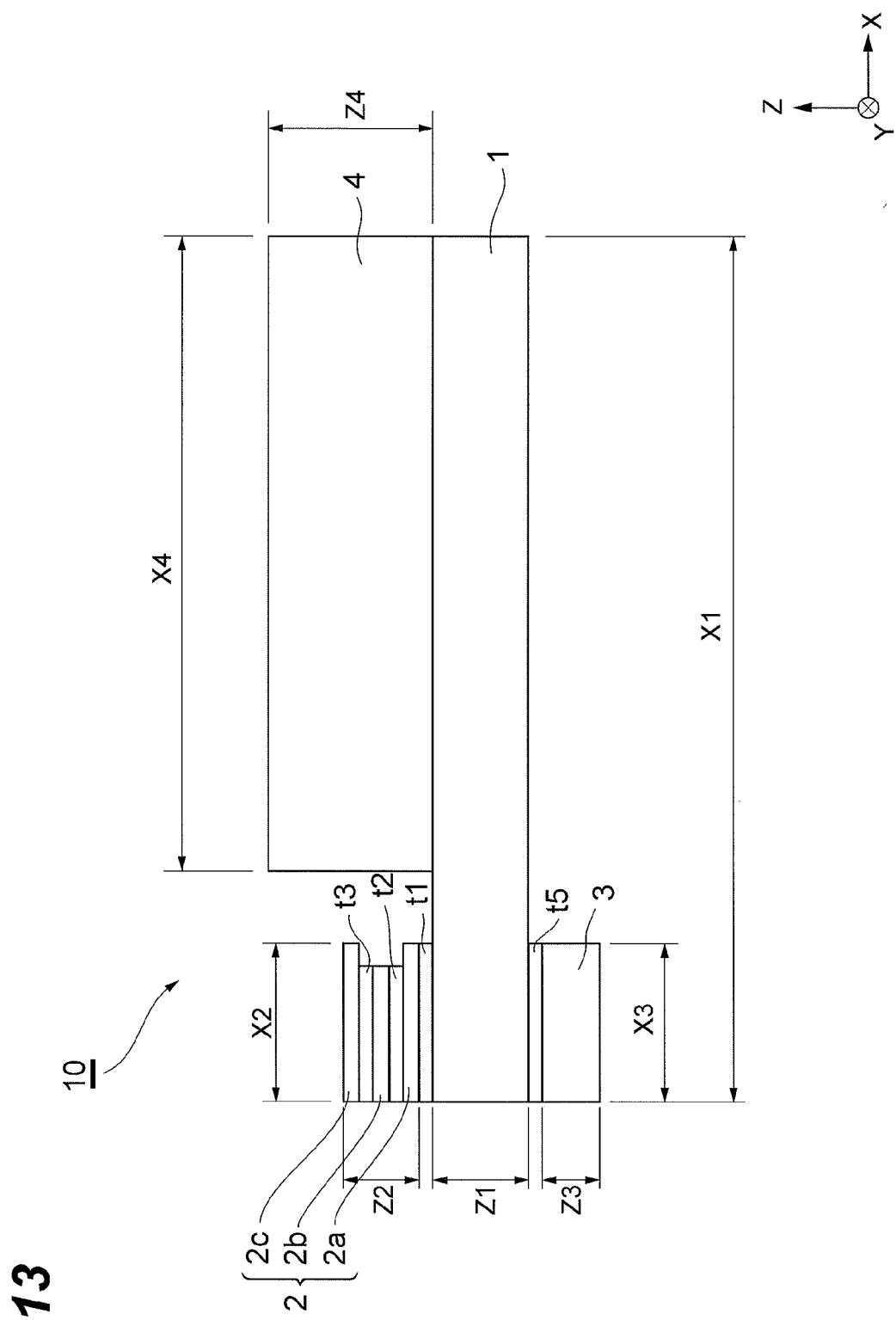
FIG. 13 is a side view illustrating a semiconductor laser unit when viewed from the direction of an arrow XIII.
Figure 14:
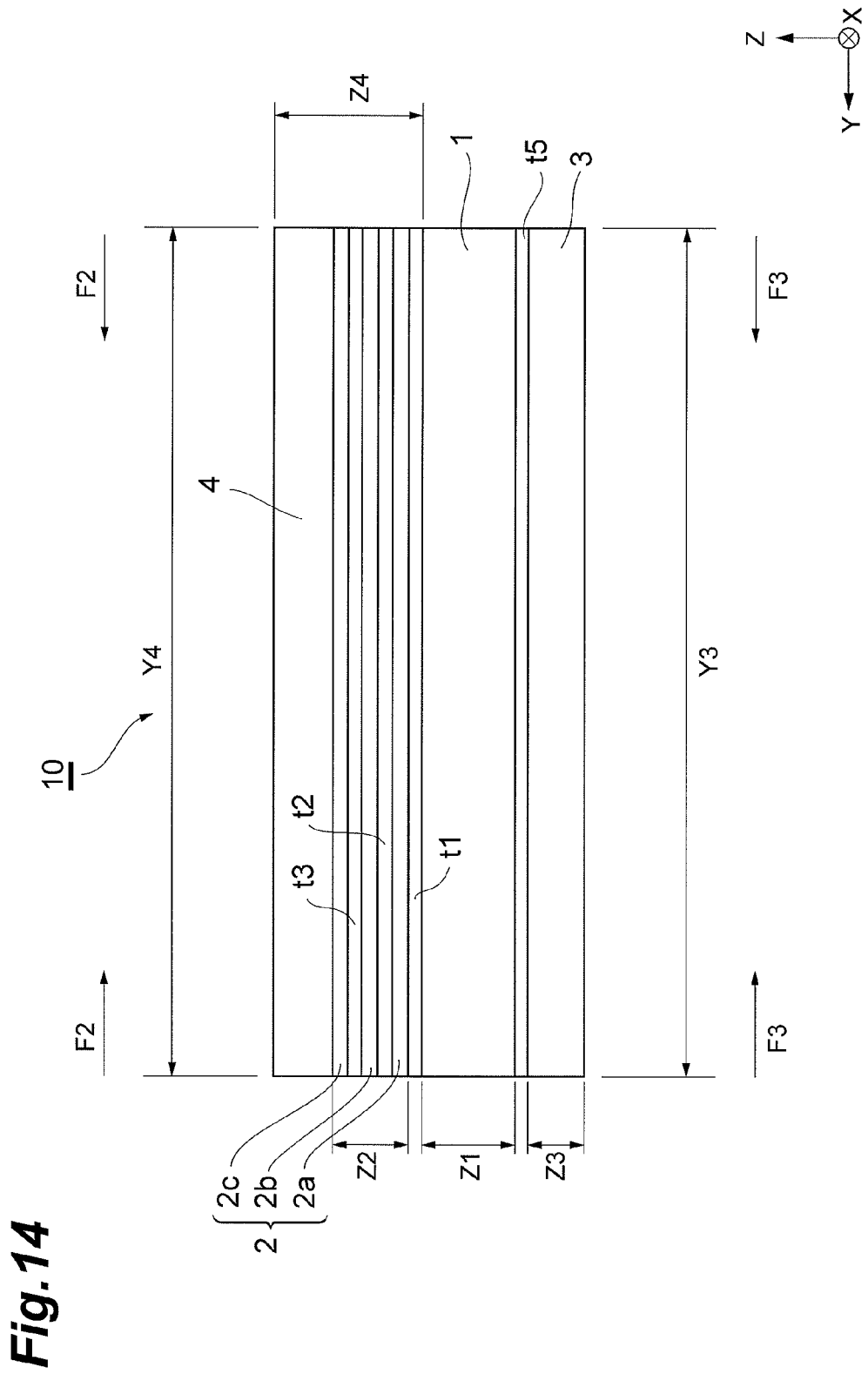
FIG. 14 is a front view illustrating a semiconductor laser unit when viewed from the direction of an arrow XIV.

FIG. 12 is a perspective view illustrating a semiconductor laser unit; FIG. 13 is a side view illustrating the semiconductor laser unit when viewed from the direction of an arrow XIII; and FIG. 14 is a front view illustrating the semiconductor laser unit when viewed from the direction of an arrow XIV.

The semiconductor laser unit includes the following: the heat sink 1; the laser module 2 fixed onto the heat sink 1; the reinforcement member 3 fixed onto the position opposed to the laser module 2 on the heat sink 1; and the spacer 4 which is disposed on the upper surface of the heat sink 1 and fixed thereto so as not to be displaced due to pressure from above. The spacer 4 functions also as a sealing material when a cooling medium such as water is introduced therein, and as required, an O-ring or the like is disposed around the openings 42 and 43 provided in the member 4.

The heat sink 1 is a plate-shaped liquid-cooled heat sink in which a fluid passage is formed. Furthermore, the heat sink 1 is 3 mm or less in thickness Z1, and thus allowed to be bent in the thickness direction when being adopted singly. The detailed structure of the heat sink 1 is illustrated in FIG. 9, to be described later.

The laser module 2 has the semiconductor laser bar 2b sandwiched between the first sub-mount 2a and the second sub-mount 2c. The first sub-mount 2a is fixed onto the upper surface of the heat sink 1 with the adhesive layer t1 interposed therebetween, and fixed onto the semiconductor laser bar 2b with the adhesive layer t2 interposed therebetween. Furthermore, the semiconductor laser bar 2 is fixed onto the second sub-mount 2c with the adhesive layer t3 interposed therebetween. That is, the first sub-mount 2a is fixedly adhered to one surface of the semiconductor laser bar 2b, while the second sub-mount 2c is fixedly adhered to the other surface of the semiconductor laser bar 2b. Note that each of the sub-mounts 2a and 2c is made of a material having a linear expansion coefficient (thermal expansion coefficient) which is less than the linear expansion coefficient of the heat sink 1, or has the shape of a plate (rectangular parallelepiped).

The sub-mounts 2a and 2c can be made of a material selected from the group consisting of Mo, W, Cu, Cu—W alloy, Cu—Mo alloy, SiC, or AlN, and each sub-mount can be made 50 to 200 μm in thickness.

The reinforcement member 3 is made up of a molybdenum (Mo) plate and fixed onto a position on a surface of the heat sink 1 opposite to the surface on which the first sub-mount is mounted, the position being opposed to the first sub-mount 2a, with the adhesive layer t5 interposed between the heat sink 1 and the reinforcement member 3. The reinforcement member 3 is made of a material having a linear expansion coefficient less than that of the heat sink 1, and unlike the sub-mounts, falls within the range of 0.1 to 0.5 mm in thickness. Note that the molybdenum reinforcement member 3 refers to a reinforcement member which is predominantly composed of molybdenum (80% or greater in weight percentage), but can provide the same effects even when being mixed with a trace amount of impurities.

Here, the sub-mounts are preferably made of a Cu—W alloy, more preferably of the reinforcement member 3 molybdenum. One reason for this is that the effect of canceling out the stress imposed on the heat sink 1 when being expanded or contracted is available, while another reason is that the following effects are also available. That is, since the Cu—W alloy has a good thermal conductivity and an expansion coefficient closer to that of the semiconductor laser bar, the Cu—W alloy is advantageous as the sub-mount of the semiconductor laser bar. Furthermore, since the feature as an electrode is also required of the sub-mount, the sub-mount is made of metal also in order to provide electrical conduction.

Note that in the XYZ three-dimensional rectangular coordinate system, assuming that the Y-axis is the direction in which light emission points are aligned (the longitudinal direction of the laser bar), the Z-axis is the direction of the thickness of the laser bar 2b, and the X-axis is parallel to the direction in which a laser beam is emitted, the exemplary dimensions (the preferred ranges) of each component are as described above. Note that the X-axis direction dimension X4 of the spacer 4 is less than dimension X1-X2; the Y-axis direction dimension Y4 is consistent with Y3; and the Z-axis direction dimension Z4 is set to be greater than Z2.

Note that all the adhesive layers t1, t2, t3, and t5 are made of solder material, each having a thickness Zt. The adhesive layers to be adopted may be made of SnAgCu or AuSn; however, the layers t2 and t3 can be made of AuSn and the layers t1 and t5 of SnAgCu. An exemplary dimension of the thickness Zt is 10 μm. Note that when the spacer 4 is made of an electrical insulator such as ceramic, an adhesive layer such as of solder material can be interposed between the resin layer and the heat sink; however, in this example, the spacer 4 is made of silicone resin (rubber) and provides insulating and sealing functions. A preferred range is from 3 to 20 μm. The effects of the aforementioned numerical range can be explained as follows. That is, for the numerical range from 3 to 20 μm, the solder is spread across the entire layer, without overflowing therefrom, so as to provide uniform bonding.

Here, the physical quantities of the liquid-cooled heat sink 1, the first sub-mount 2a, the semiconductor laser bar 2b, the second sub-mount 2c, and the molybdenum reinforcement member 3 are adjusted so as to substantially eliminate the bending of the semiconductor laser bar.

Figure 15:
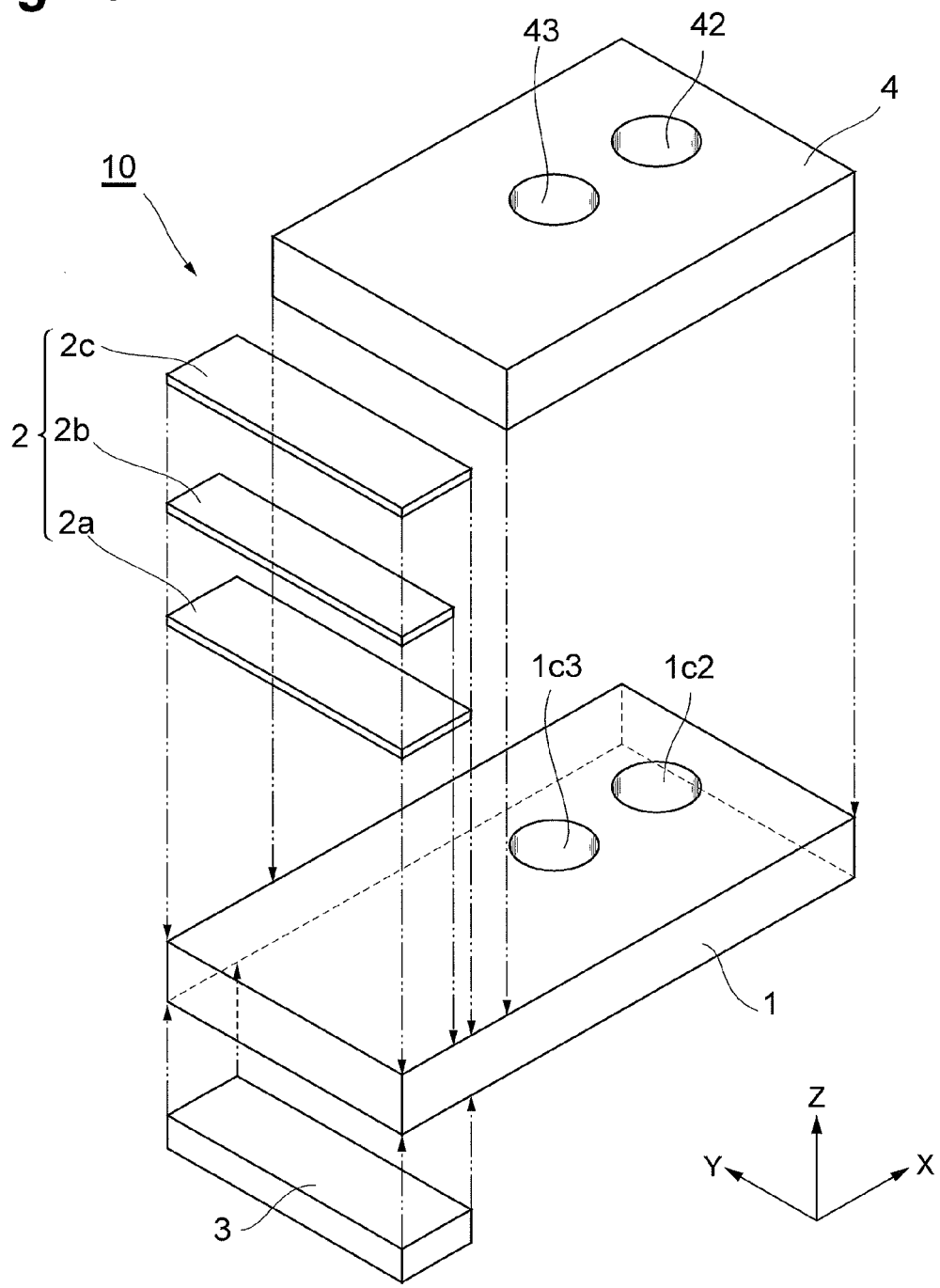
FIG. 15 is an exploded perspective view illustrating a semiconductor laser unit.

FIG. 15 is an exploded perspective view illustrating a semiconductor laser unit.

The heat sink 1 has the openings (through holes) 1c2 and 1c3 to introduce a cooling medium, which communicate with the openings (through holes) 42 and 43 of the spacer 4. The spacer 4 provided as required functions to seal the cooling medium. For the semiconductor laser stack, however, the spacer 4 can be provided on the uppermost laser unit so that this will serve as a spacer when the stack is incorporated into an external apparatus.

The laser module 2 is disposed on the upper surface side of the heat sink 1 with an adhesive layer interposed therebetween, and the reinforcement member 3 is disposed on the rear surface side with an adhesive layer interposed therebetween. Then, heat and pressure are applied at the same time to these components in the Z-axis direction, and after that, the components are cooled to room temperature to be thereby fixed. The temperature should be just enough to melt the adhesive layers. As required, the spacer 4 is disposed onto the upper surface of the heat sink 1 with an adhesive layer interposed therebetween, and heat and pressure are applied in the same manner thereto so that the components are fixed. In this fixing procedure, the components of all the semiconductor laser units 10 can be fixed at the same time after having been stacked in layers. In this case, because all stresses are imposed on each component at the same time in the fixing step, an advantage of a reduction in distortion in each component is available. That is, when an adhesive layer is interposed between each of the components 3, 1, 2a, 2b, 2c, and 4, and heat is applied thereto at the same time to thereby fix the same, the rigidity of the entire assembly is considerably improved. As a matter of course, the units 10 may be individually bonded, and only pressure may be applied to the completed units 10 with the spacer 4 interposed therebetween so that the units 10 are fixed without any adhesive. When bent units 10 are stacked in layers, this would lead to a gap causing water leakage or faulty electrical continuity. However, the units 10 bending of which is restrained would have an advantage of being easily stacked in layers and be resistant to aforementioned failures or the like.

Note that the structure of the semiconductor laser bar is as shown in FIG. 5.

An exploded perspective view of the structure of the liquid-cooled heat sink is as shown in FIG. 6.

Figure 16:
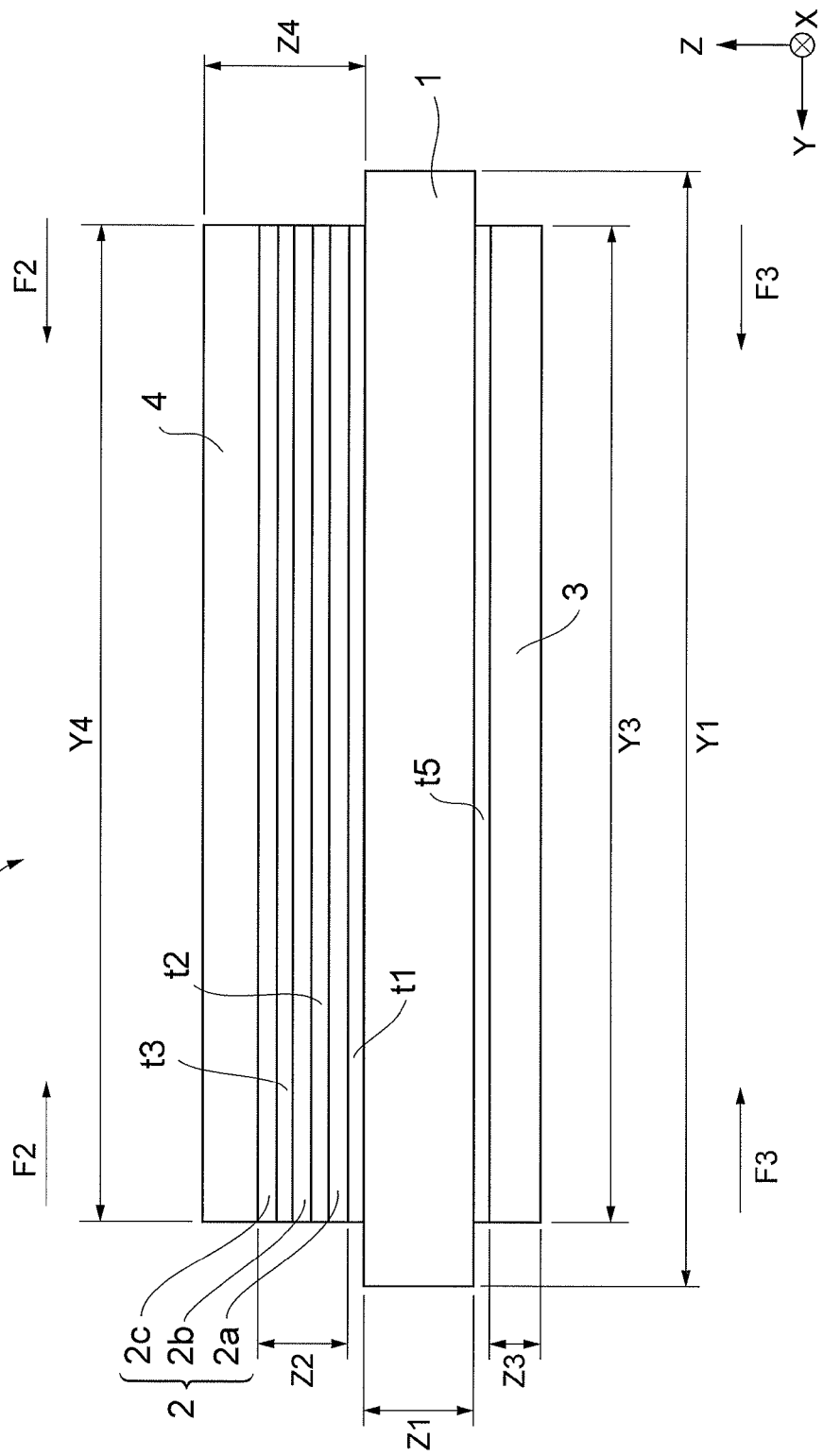
FIG. 16 is a front view illustrating a semiconductor laser device with a heat sink increased in dimension in the width direction.

FIG. 16 is a front view illustrating a semiconductor laser unit with a heat sink increased in dimension in the width direction.

Although the Y direction length Y1 of the heat sink 1 was consistent with the Y direction length Y3 of the reinforcement member 3 in the aforementioned descriptions, Y1 may be greater than Y3 as illustrated in the figure. Furthermore, the X direction length of the heat sink 1 may be greater than that of the aforementioned embodiment. Even in this case, the same effects as those of the aforementioned embodiment are also available.

Figure 17:
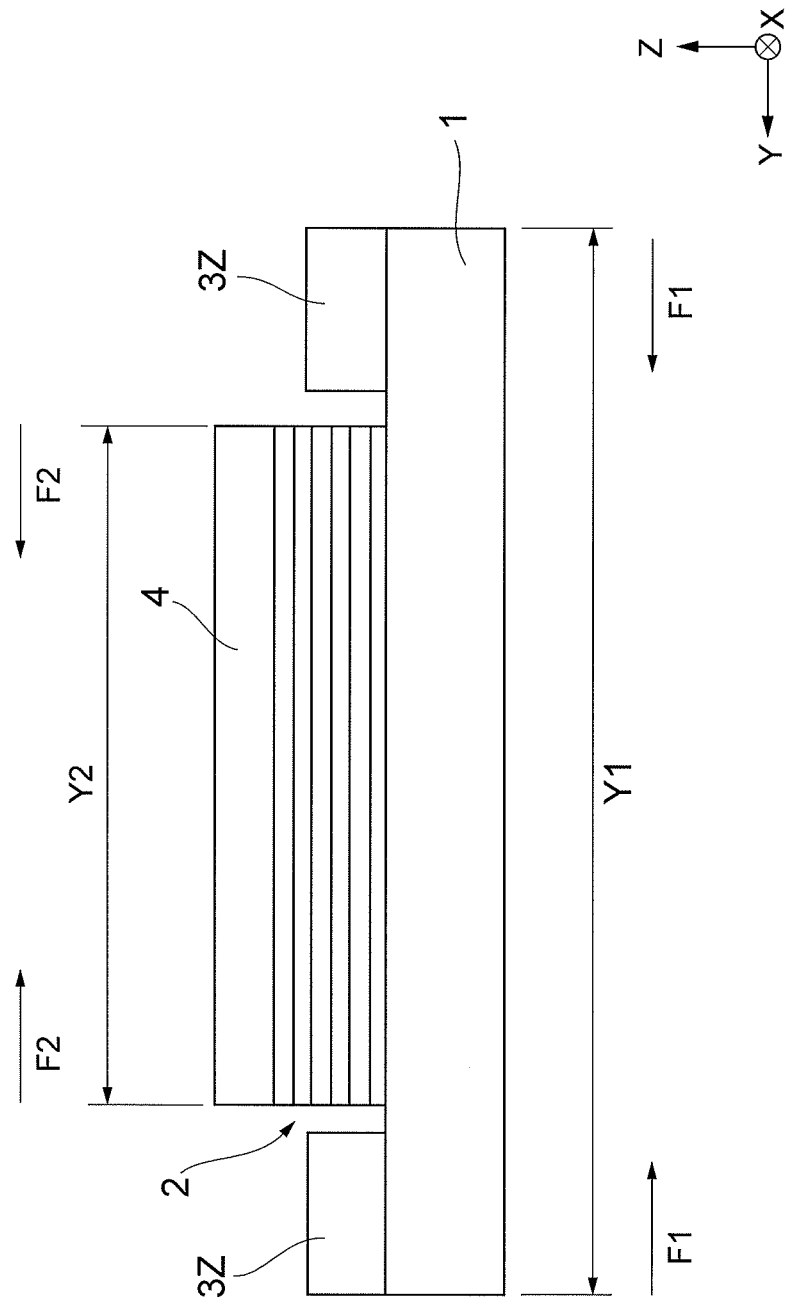
FIG. 17 is a front view illustrating a semiconductor laser unit as a comparative example.

FIG. 17 is a front view illustrating a semiconductor laser unit as a comparative example.

In this comparative example, the semiconductor laser unit of the embodiment shown in FIG. 14 is adopted such that the mounting position of the reinforcement member 3 was changed to the both sides on the upper surface of the heat sink 1 and adopted as the reinforcement members 3Z. The structure of the other components in the comparative example is the same as that shown in FIG. 14.

When the aforementioned liquid-cooled heat sink such as the water-cooled heat sink having a high performance is reduced in thickness, the heat sink tends to be bent due to the difference in linear expansion coefficient between the heat sink and the laser module 2.

In the case of the comparative example, when the heat sink 1 is cooled, force will act thereon so as to contract the same in the direction of the arrow F1; however, force will act on the semiconductor laser module 2 so as to contract the same in the direction of the arrow F2 because the semiconductor laser module 2 is less than the heat sink 1 in linear expansion coefficient. That is, due to the difference in linear expansion coefficient, the heat sink tends to be deformed in an upwardly convex manner. As a matter of course, since the reinforcement members 3Z are fixed, the expansion or contraction of the heat sink 1 will be slightly alleviated; however, the entire deformation cannot be restrained.

On the other hand, as with the embodiment shown in FIG. 14, the molybdenum reinforcement member 3 having a low linear expansion coefficient is fixed to the side opposite to the side on which the laser module 2 is mounted. This leads to a tendency to cancel out the force which acts on the heat sink 1 as the stress (the force denoted by the arrow F2) from the laser module 2 side so as to bend the same and the force which acts on the heat sink 1 as the stress (the force denoted by the arrow F3) from the reinforcement member 3 side so as to bend the same. Furthermore, the reinforcement member 3 mounted onto the heat sink 1 provides an improved rigidity to the entire assembly. The adoption of the stack structure which performs simultaneous bonding contributes to a reduction in the stresses which would act upon the semiconductor laser bar in both directions, i.e., from upper and below surfaces of the laser bar. Thus, according to the semiconductor laser device with the semiconductor laser units 10 of the embodiment stacked in layers, the bending of the heat sink 1 is restrained and the displacement of the light emission point positions is restrained, thus restraining deterioration in light emission property.

Furthermore, in the case of the aforementioned structure, since the deformation of the heat sink 1 is restrained, it is possible to restrain water leakage from the heat sink 1. Furthermore, when a power supply line to the laser is attached to the sub-mounts (power is supplied between the sub-mounts sandwiching the semiconductor laser bar when the laser is activated), it is possible to restrain the supply line from being dislodged. Furthermore, when a lens is disposed in front of the semiconductor laser unit, it is possible to yield a high-precision product because the light emission point positions are not dislocated.

REFERENCE SIGNS LIST

10: Semiconductor laser device, 1: heat sink, 2: semiconductor laser module, 3: molybdenum reinforcement member.

The invention claimed is:

1. A semiconductor laser device comprising:
   a semiconductor laser bar having a plurality of light emission points arrayed on a straight line;
   a plate-shaped liquid-cooled heat sink in which a fluid passage is formed and which has a thickness equal to or less than 3 mm;
   a first sub-mount which is fixed onto one surface of the semiconductor laser bar, made of a material having a linear expansion coefficient less than that of the heat sink, and fixed onto the heat sink;
   a second sub-mount which is fixed onto the other surface of the semiconductor laser bar and made of a material having a linear expansion coefficient less than that of the heat sink; and
   a molybdenum reinforcement member fixed onto a position on a surface of the heat sink opposite to the surface on which the first sub-mount is mounted, the position being opposed to the first sub-mount, the molybdenum reinforcement member having a linear expansion coefficient less than that of the heat sink and a thickness of 0.1 to 0.5 mm,
   wherein the molybdenum reinforcement member, the heat sink, the first sub-mount, the semiconductor laser bar and the second sub-mount are arranged in this order.

2. A semiconductor laser device having a plurality of semiconductor laser units stacked in layers, the semiconductor laser device characterized in that the individual semiconductor laser unit comprises:
   a plate-shaped liquid-cooled heat sink in which a fluid passage is formed;
   a semiconductor laser module made up of a semiconductor laser bar and fixed onto one surface side of the heat sink, the semiconductor laser bar being sandwiched by a pair of sub-mounts; and
   a molybdenum reinforcement member fixed onto a position on the other surface side of the heat sink, the position being opposed to the semiconductor laser module, the molybdenum reinforcement member having a thickness of 0.1 to 0.5 mm and a linear expansion coefficient less than that of the heat sink; and
   one surface of the molybdenum reinforcement member of one of the semiconductor laser units is fixed onto the heat sink of the same semiconductor laser unit, and the other surface is fixed onto the semiconductor laser module of another semiconductor laser unit,
   wherein the molybdenum reinforcement member, the heat sink and the semiconductor laser module are arranged in this order.

\* \* \* \* \*